United States Patent
Dai et al.

(10) Patent No.: US 10,044,365 B1
(45) Date of Patent: Aug. 7, 2018

(54) TIME-TO-DIGITAL CONVERTER (TDC)-BASED QUANTIZER

(71) Applicant: QUALCOMM Incorporated, San Diego, CA (US)

(72) Inventors: Liang Dai, San Diego, CA (US); Kentaro Yamamoto, San Diego, CA (US); Omid Rajaee, San Diego, CA (US); Li Lu, San Diego, CA (US); Dinesh Alladi, San Diego, CA (US); Changsok Han, Gainesville, FL (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/843,718

(22) Filed: Dec. 15, 2017

(51) Int. Cl.
   *H03M 1/50* (2006.01)
   *H03L 7/081* (2006.01)
   *H04W 84/04* (2009.01)
   *H03M 3/00* (2006.01)

(52) U.S. Cl.
   CPC ............ *H03M 1/50* (2013.01); *H03L 7/0812* (2013.01); *H03M 3/424* (2013.01); *H04W 84/042* (2013.01)

(58) Field of Classification Search
   None
   See application file for complete search history.

(56) References Cited

U.S. PATENT DOCUMENTS

| | | | |
|---|---|---|---|
| 3,581,196 A * | 5/1971 | Spaid | G01R 27/2605 324/678 |
| 4,851,839 A * | 7/1989 | Reinke | H03M 1/1255 324/99 D |
| 7,843,249 B2 | 11/2010 | Zhang et al. | |
| 8,144,047 B2 * | 3/2012 | Lin | H03M 1/52 341/155 |
| 8,471,751 B2 | 6/2013 | Wang | |
| 9,246,500 B2 | 1/2016 | Perrott | |
| 9,673,835 B1 | 6/2017 | Kinyua | |
| 2006/0087467 A1 * | 4/2006 | Itskovich | G04F 10/005 341/155 |

OTHER PUBLICATIONS

Kim T., et al., "A 4th-Order Continuous-Time Delta-Sigma Modulator Using 6-bit Double Noise-Shaped Quantizer", IEEE Journal of Solid-State Circuits, 2017, pp. 1-14.

* cited by examiner

*Primary Examiner* — Howard Williams
(74) *Attorney, Agent, or Firm* — Patterson & Sheridan, L.L.P.

(57) ABSTRACT

Certain aspects of the present disclosure provide apparatus and techniques for analog-to-digital conversion using a time-to-digital converter (TDC). For example, certain aspects provide a quantizer using a TDC. The quantizer may include at least one first capacitive element and a set of switches configured to selectively couple a first terminal and a second terminal of the at least one first capacitive element to at least one input voltage source. The TDC may also include a reference voltage source, at least one switch coupled between the second terminal of the at least one first capacitive element and an output of the reference voltage source, a current source selectively coupled to the first terminal of the at least one first capacitive element, and a voltage sense circuit coupled to the first terminal of the at least one first capacitive element.

29 Claims, 9 Drawing Sheets

US 10,044,365 B1

TIME-TO-DIGITAL CONVERTER (TDC)-BASED QUANTIZER

TECHNICAL FIELD

Certain aspects of the present disclosure generally relate to electronic circuits and, more particularly, to a time-to-digital converter (TDC)-based quantizer.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. In some cases, the base station and/or mobile station may include one or more analog-to-digital converters (ADCs) for converting analog signals to digital signals for processing in the digital domain.

SUMMARY

Certain aspects of the present disclosure provide apparatus and techniques for analog-to-digital conversion using a time-to-digital converter (TDC).

Certain aspects of the present disclosure are generally directed to a quantizer using a time-to-digital converter (TDC). The quantizer may include at least one first capacitive element; a set of switches configured to selectively couple a first terminal and a second terminal of the at least one first capacitive element to at least one input voltage source; a reference voltage source; at least one switch coupled between the second terminal of the at least one first capacitive element and an output of the reference voltage source; a current source selectively coupled to the first terminal of the at least one first capacitive element; and a voltage sense circuit coupled to the first terminal of the at least one first capacitive element.

Certain aspects of the present disclosure are generally directed to a method for analog-to-digital conversion. The method generally includes charging one or more first capacitive elements based on one or more input voltages during a first phase; sinking a discharge current from a first terminal of each of the one or more first capacitive elements during a second phase; generating a reference voltage provided to a second terminal of each of the one or more first capacitive elements during the second phase; and generating a digital signal based on an amount of time spanning from a beginning of the second phase to at time at which a voltage at the first terminal reaches a threshold voltage.

Certain aspects of the present disclosure are generally directed to an apparatus for analog-to-digital conversion. The apparatus generally includes means for charging one or more first capacitive elements based on one or more input voltages during a first phase; means for sinking a discharge current from a first terminal of each of the one or more first capacitive elements during a second phase; means for generating a reference voltage provided to a second terminal of each of the one or more first capacitive elements during the second phase; and means for generating a digital signal based on an amount of time spanning from a beginning of the second phase to a time at which a voltage at the first terminal reaches a threshold voltage.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
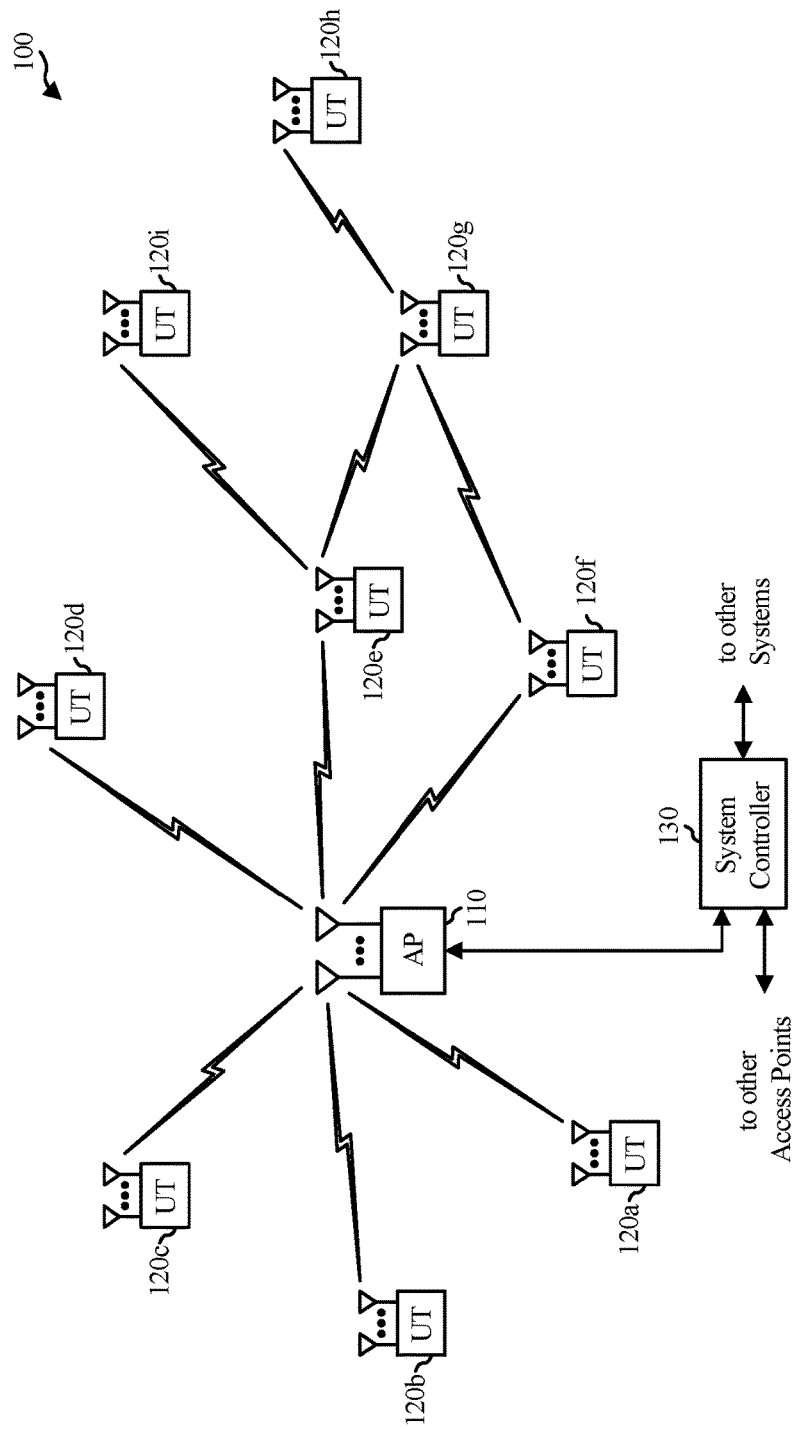
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include one or more analog-to-digital converters (ADCs) for converting an analog signal to a digital signal for processing in the digital domain.

Figure 2:
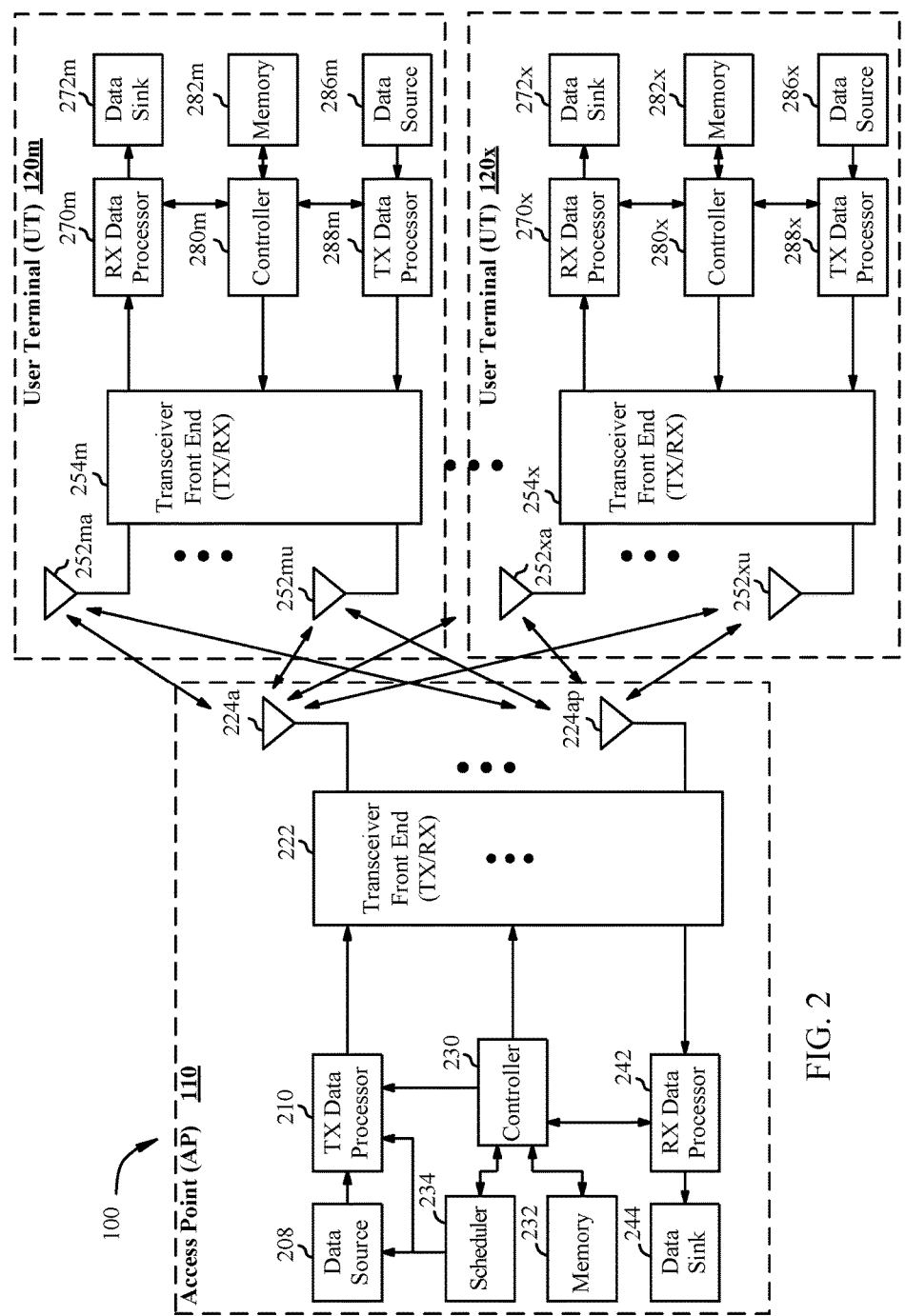
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include one or more ADCs for converting an analog signal to a digital signal for processing in the digital domain.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
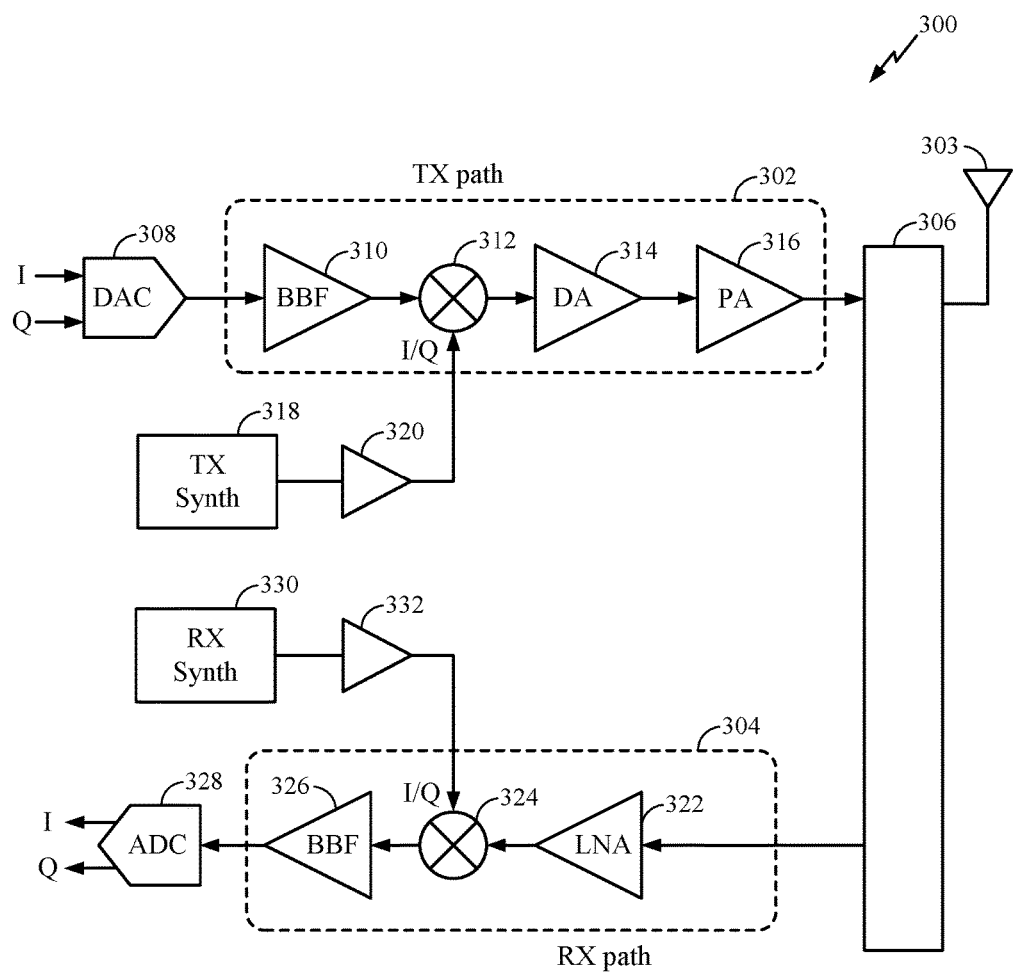
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, the BBF 326 may include a tunable active filter as described below. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an ADC 328 to digital I or Q signals for digital signal processing. In certain aspects the ADC 328 may be implemented as a time-to-digital converter (TDC), as will be described in more detail herein.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects provided herein can be implemented in any of various other suitable systems to convert analog signals to digital signals for processing in the digital domain.

Example Time-to-Digital (TDC)-Based Quantizer

A quantizer is commonly used in sigma-delta analog-to-digital converters (ADCs). As the sampling frequency of the ADC increases, it becomes increasingly challenging to design a multi-bit quantizer with low power consumption. There are different types of quantizers such as flash quantizers, successive approximation register (SAR) quantizers, voltage-controlled oscillator (VCO)-based quantizers, and time-based quantizers. Flash quantizers are implemented using $2^n-1$ comparators, where n is the number of bits of the flash quantizer. Flash quantizers are fast but consume a large amount of power, and may suffer from comparator offset and noise. SAR quantizers may be implemented using a single comparator and with a low voltage power supply. SAR quantizers also suffer from comparator noise and are slower than flash quantizers. VCO-based quantizers perform analog-to-digital conversion by measuring a frequency of a VCO and are sensitive to process, voltage, and temperature (PVT) variations.

Time-to-digital converter (TDC)-based quantizers convert an analog signal to a digital signal by charging a capacitor using the analog signal and measuring how long it takes for the capacitor to discharge down to a certain voltage threshold. The speed of a TDC-based quantizer may be limited by a comparator used to detect the voltage across the capacitor. TDC-based quantizers may also suffer from PVT variation of the capacitor and discharging current, and may rely on a high-speed clock with a known frequency. Certain aspects of the present disclosure provide a high-speed TDC-based quantizer that may operate independent of PVT variations.

Figure 4:
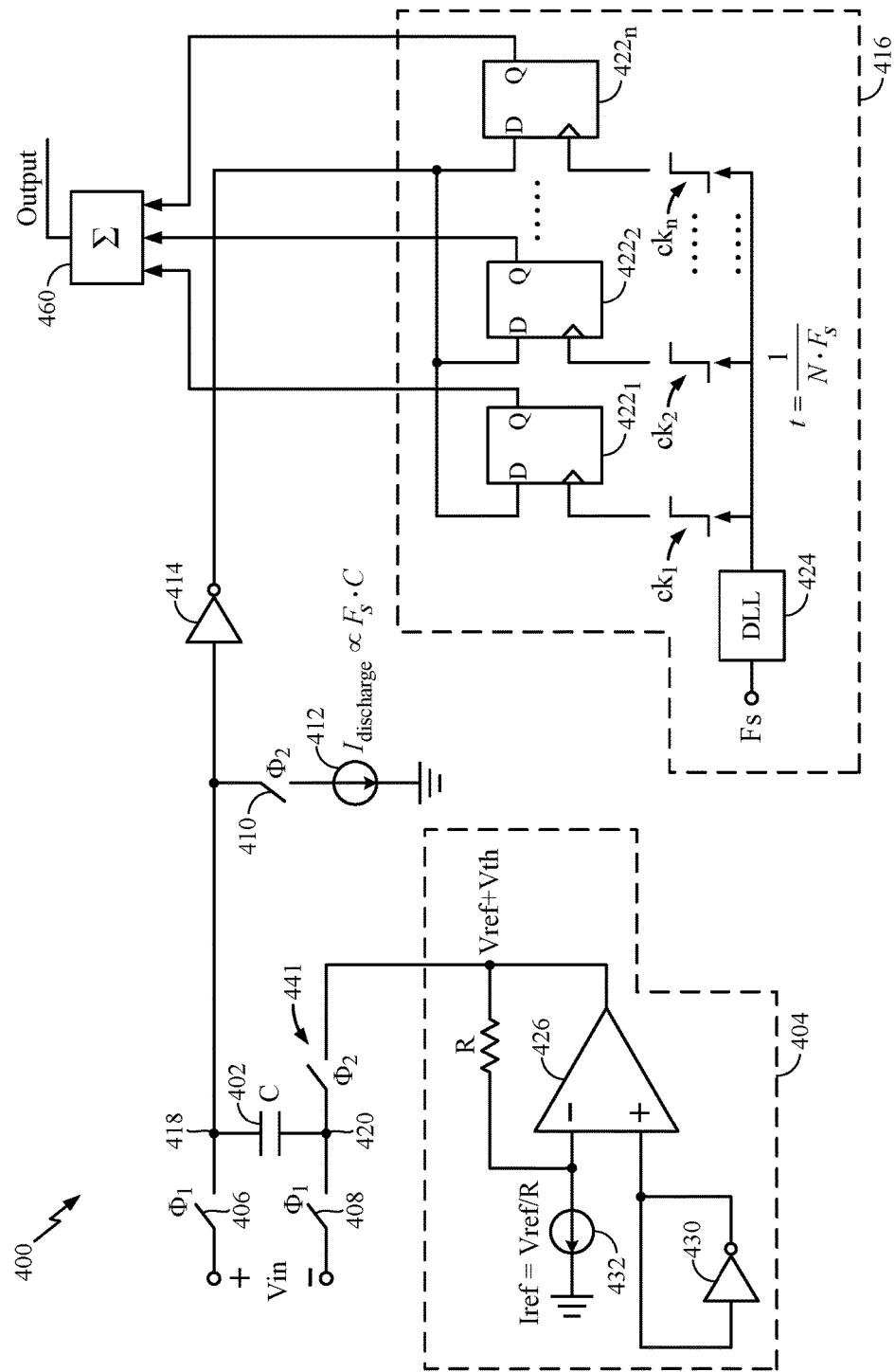
FIG. 4 is a block diagram illustrating an example time-to-digital converter (TDC)-based quantizer, in accordance with certain aspects of the present disclosure.

FIG. 4 is a block diagram of an example TDC-based quantizer 400, in accordance with certain aspects of the present disclosure. As illustrated, an input voltage Vin is sampled on the capacitor 402 during a first phase Φ1 by closing switches 406 and 408. In other words, the capacitor 402 is charged to the input voltage Vin during the first phase Φ1. During a second phase Φ2, the switches 406 and 408 are opened, and the charge across the capacitor 402 is discharged using a current source 412 by closing a switch 410. The voltage across the capacitor 402 is sensed by a voltage sense circuit, which is implemented as an inverter 414 in FIG. 4. While the voltage sense circuit is implemented as a inverter 414 in FIG. 4, the voltage sense circuit may be implemented as any comparison circuit for comparing the voltage at the input of the comparison circuit with a voltage threshold, and providing an indication of when the voltage at the input reaches (e.g., drops below) the voltage threshold. For example, when the voltage at the input of the inverter 414 drops below a trip point (voltage threshold) of the inverter 414, the output of the inverter 414 may switch from logic low to logic high. An edge detection circuit 416 then detects the rising edge at the output of the inverter 414. The edge detection circuit 416 then generates a digital signal representing the input voltage Vin based on an amount of time from the beginning of the second phase to when the rising edge at the output of the inverter is detected, as will be described in more detail herein.

In certain aspects, during the second phase Φ2, a terminal of the capacitor 402 at node 420 may be coupled to a reference voltage source 404 by closing switch 441. The reference voltage source 404 may be configured to supply a reference voltage equal to the sum of a reference voltage Vref of the TDC-based quantizer 400 and a threshold voltage Vth, where the threshold voltage Vth is the trip point of the inverter 414. Without the reference voltage source 404, the input to the inverter 414 may be bound between −Vref and Vref, but with the inclusion of the reference voltage source 404, the input to the inverter 414 may be bound between Vth and Vth+(2×Vref). Therefore, with the inclusion of the reference voltage source 404, the upper and lower bounds of the voltage at the input of the inverter 414 is shifted up such that the lower bound of the input voltage Vin is set to the threshold voltage Vth of the inverter 414.

As illustrated, the capacitor 402 is discharged during the second phase Φ2 by the current source 412 using a current ($I_{discharge}$) that is proportional to a product of the sampling frequency (Fs) of the TDC-based quantizer 400 and the capacitance C of the capacitor 402. When the voltage at node 418 drops below the threshold voltage Vth, the output of the inverter 414 goes high. The time that it takes to discharge the capacitor 402 is equal to:

$$\frac{(Vin + Vref) \times C}{I_{discharge}}$$

In certain aspects, the edge detection circuit 416 may be implemented using a delay locked loop (DLL) 424 and a series of flip-flops (FFs) $422_1$ to $422_n$ (collectively referred to as "FFs 422"). The state of the FFs 422 provides a digital representation of the input voltage Vin. For example, the DLL 424 generates a series of clock signals $ck_1$ to $ck_n$ having transition edges at different times based off the ADC sampling clock (e.g., frequency of signal used to control switches 406 and 408), each of the signals generated by the DLL 424 is provided to a CLK input of a different one of the FFs 422. The time between each transition edge provided by the DLL 424 may be equal to:

$$\frac{1}{N \times Fs}$$

where N is the number of stages in the DLL corresponding to the number of FFs 422, and Fs is the sampling frequency of the ADC sampling clock. The series of clock edges generated by the DLL 424 are provided to the CLK inputs of the FFs 422 staggering a time at which each FF latches and provides the output signal of the inverter 414 to the output Q of the FF. Thus, all FFs that receive a rising edge at the CLK input after the output signal of the inverter 414 transitions to logic high will latch the logic high output of the inverter 414, and all other FFs will provide an output of logic low. Therefore, the higher the voltage of the input voltage Vin, the longer it takes for the output of the inverter 414 to transition from logic low to logic high, resulting in an increased number of flip-flops that latch a logic low.

In certain aspects, the outputs of the FFs 422 may be input to digital logic (e.g., summed by a summer 460) to provide an output digital value that represents the input voltage Vin. The output digital value may be proportional to (Vin+Vref)×N which is independent of the ADC sampling frequency, and thus, the output digital value may be generated independent of process, voltage, and temperature (PVT) variations.

In certain aspects, the reference voltage source 404 may be implemented using an operational amplifier 426 having a positive input terminal coupled to an input voltage node set at the threshold voltage Vth. Setting the positive input terminal at the threshold voltage Vth may be implemented using an inverter 430 that is a replica of the inverter 414, and coupling the input to the output of the inverter 430, as illustrated. The reference voltage source 404 may also include a resistance R implemented by a feedback resistor coupled between an output of the amplifier 426 and the negative input terminal of the amplifier 426. The negative input terminal of the amplifier may also be coupled to a current source 432 that sinks a current Iref that is proportional to:

$$\frac{Vref}{R}$$

The current Iref flows across the feedback resistor with resistance R such that the voltage drop across the feedback resistor is equal to the reference voltage Vref. Therefore, the voltage at the output of the amplifier 426 is equal to the sum of the reference voltage Vref and the threshold voltage Vth, such that voltages at the negative and positive input terminals of the amplifier 426 are equal (e.g., are equal to Vth).

Figure 5:
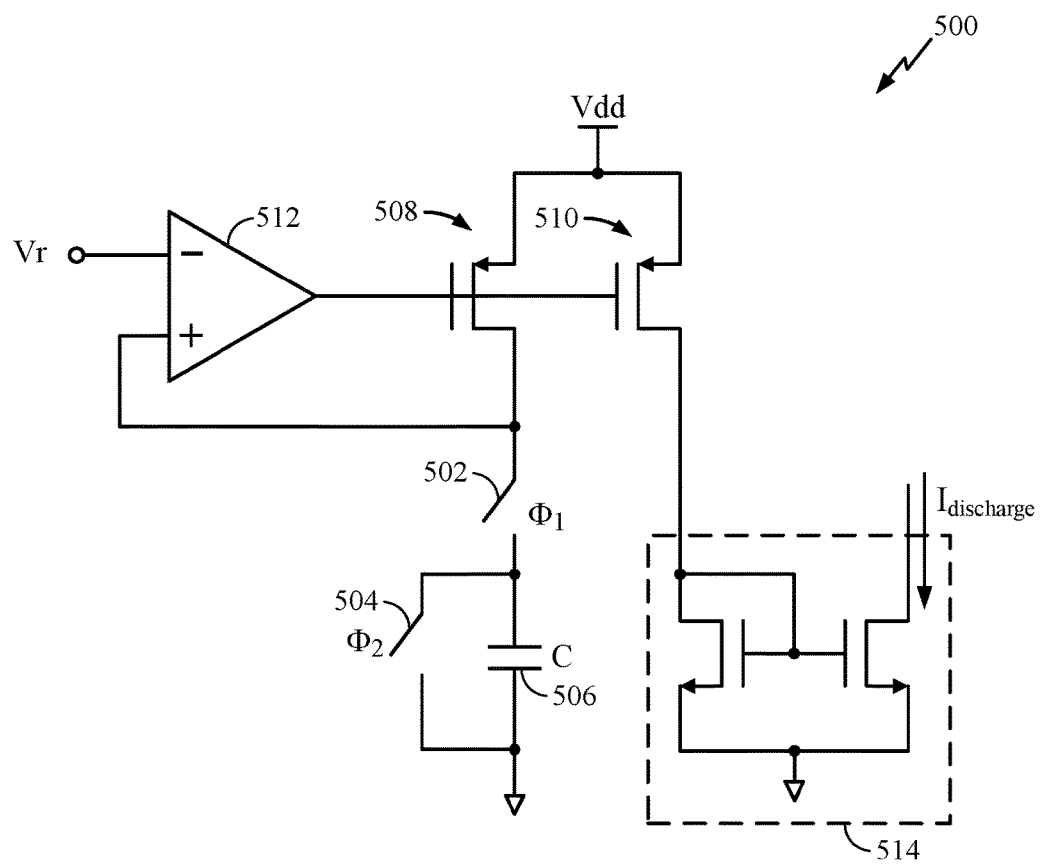
FIG. 5 is a schematic diagram of an example circuit for generating a discharge current, in accordance with certain aspects of the present disclosure.

FIG. 5 is a schematic diagram of an example circuit 500 for generating a current ($I_{discharge}$) that is proportional to the product of Fs and C, in accordance with certain aspects of the present disclosure. For example, the circuit 500 may implement the current source 412 of FIG. 4. As illustrated in FIG. 5, two switches 502 and 504 are opened and closed during the first phase Φ1 and the second phase Φ2 to charge/discharge a capacitor 506 at the sampling frequency Fs. For example, switch 502 may be closed during the first phase Φ1 and open during the second phase Φ2, and switch 504 may be open during the first phase Φ1 and closed during the second phase Φ2. By opening and closing switches 502 and 504 at the sampling frequency Fs, the capacitor 506 effectively operates as a resistor having a resistance equal to $$\frac{1}{F_s \times C}$$

where C is the capacitance of the capacitor 506, which may equal the capacitance of capacitor 402. An amplifier 512 drives the gates of transistors 508 and 510 such that the voltage at the positive terminal of the amplifier 512 is equal to a reference voltage Vr. Thus, the source-to-drain current of the transistor 508 may be equal to Vr×Fs×C Since the sources of the transistors 508 and 510 are coupled together, as well as the gates thereof, the source-to-drain current of transistor 508 is equal to the source-to-drain current of transistor 510, which is mirrored by the current mirror 514. Therefore, the current mirror 514 generates the output current $I_{discharge}$ that is proportional to Fs×C.

Figure 6:
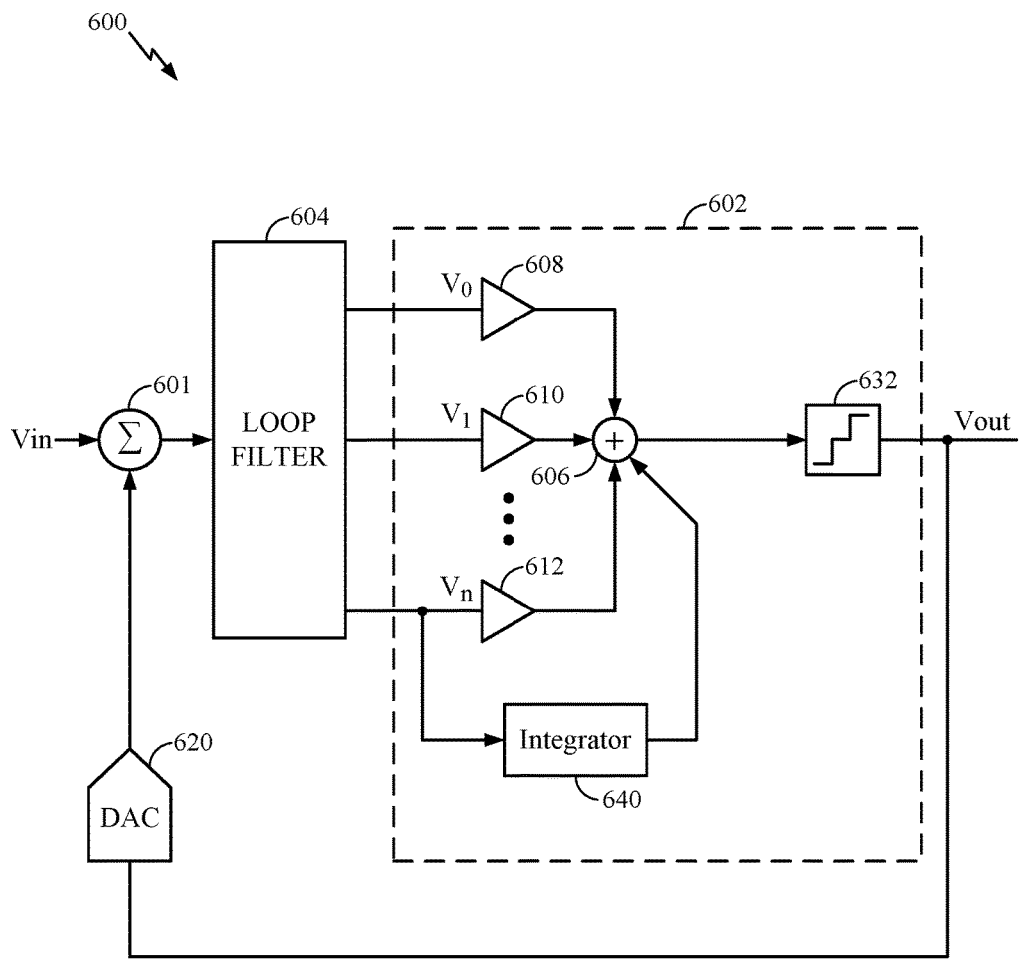
FIG. 6 is a block diagram illustrating an example delta-sigma modulator, in accordance with certain aspects of the present disclosure.

FIG. 6 is a block diagram of an example delta-sigma modulator 600, in accordance with certain aspects of the present disclosure. The delta-sigma modulator 600 includes a summer 601 that receives a feedback signal through a digital-to-analog converter (DAC) 620 and an input signal Vin, and provides a signal representing the difference between the input signal Vin and the feedback signal to a loop filter 604. The loop filter 604 provides multiple feed-forward inputs $V_0$, $V_1$, . . . $V_n$ to a quantizer 602, as illustrated. In some cases, the feedforward inputs $V_0$, $V_1$, . . . , $V_n$ may be provided to a summer 606 through respective feedforward amplifiers 608, 610, and 612, as illustrated. The output of the summer may be provided to an ADC 632 to provide the digital output Vout. In certain aspects of the present disclosure, the ADC 632 may be implemented as a TDC.

Certain aspects of the present disclosure are generally directed to reducing a DC offset of the quantizer 602. For example, the quantizer 602 may also include a direct-current (DC) integrator 640 for reducing the DC offset. The DC offset may be present in the last feedforward input signal $V_n$. The DC integrator 640 integrates a DC component of the input signal $V_n$ and provides the integrated DC component of the input signal $V_n$ to the summer 606, effectively setting the DC average of the feedforward input signal $V_n$ close to zero. Certain aspects of the present disclosure are generally directed to a TDC-based quantizer configured to reduce the DC offset of the input voltage $V_n$.

Figure 7:
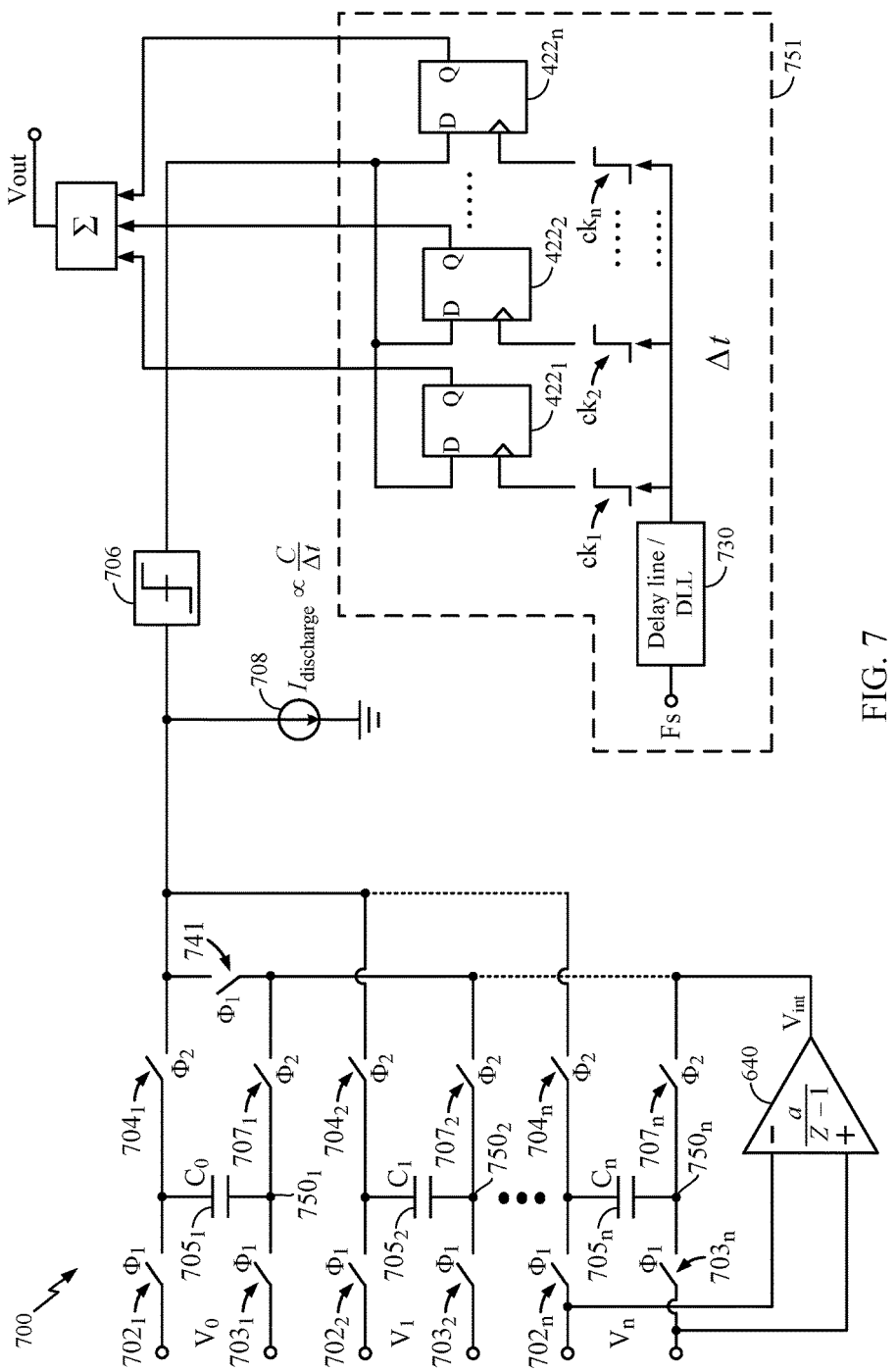
FIG. 7 is a block diagram illustrating an example TDC-based quantizer having a direct-current (DC) integrator, in accordance with certain aspects of the present disclosure.

FIG. 7 is a block diagram of an example TDC-based quantizer 700 having a DC integrator 640, in accordance with certain aspects of the present disclosure. As illustrated, the input voltages $V_0$, $V_1$, . . . , $V_n$ are sampled on capacitors $705_1$, $705_2$, . . . , $705_n$ (collectively referred to as "capacitors 705") during a first phase Φ1 by closing switches $702_1$, $702_2$, . . . , $702_n$ (collectively referred to as "switches 702") and switches $703_1$, $703_2$, . . . , $703_n$ (collectively referred to as "switches 703"). In certain aspects, the capacitances $C_0$, $C_1$, . . . , $C_n$ of the capacitors 705 may be the same capacitance C, within a suitable tolerance. During a second phase Φ2, the switches 702 and 703 are opened, switches $704_1$, $704_2$, . . . , $704_n$ (collectively referred to as "switches 704") are closed, and switches $707_1$, $707_2$, . . . , $707_n$ (collectively referred to as "switches 707") are closed, coupling the capacitors 705 to a voltage sense circuit and a current source 708. The current source 708 sinks a discharge current $I_{discharge}$. In the example TDC-based quantizer 700, the voltage sense circuit is implemented as a zero-crossing detector (ZCD) 706, but may be implemented as any type of comparison circuit for comparing the voltage across capacitors 705 with a threshold voltage. The ZCD 706 detects a time at which the voltage across the capacitors 705 reaches zero, and provides a logic high to an edge detection circuit 751 for determining the digital output signal Vout. The edge detection circuit 751 includes a delay line 730 that generates clock signals for each of the FFs 422 having transition edges (e.g., from logic low to logic high) at different times, as will be described in more detail with respect to FIG. 8. In certain aspects, the delay line 730 may be an open loop delay line, or a closed loop delay line (e.g., implemented as a DLL).

In certain aspects, the DC integrator 640 integrates the input voltage $V_n$ and generates a voltage $V_{int}$. The voltage $V_{int}$ is applied to a terminal of each of the capacitors 705 at nodes $750_1$, $750_2$, . . . , $750_n$ (collectively referred to as "nodes 750") via switches 704 and 707 during the second phase Φ2, shifting the voltage at the input of the ZCD 706, cancelling the effect of the DC offset at the input of the ZCD 706. In certain aspects, the output of the DC integrator 640 may be coupled to the current source 708 during the first phase Φ1 by closing switch 741.

In certain aspects, the discharge current sunk by the current source 708 may be proportional to $$\frac{C}{\Delta t}$$

where C is the capacitance of the capacitors 705, and Δt represents the resolution (e.g., the least significant bit (LSB)) of the TDC-based quantizer 700. For example, Δt may represent a time difference between two consecutive transition edges of the clock signals generated by the delay line 730. Thus, the time it takes to discharge the capacitors 705 may be represented by the following equation:

$$\frac{V_0 \times C_0 + V_1 \times C_1 + V_n \times C_n}{I_{discharge}}$$

Figure 8A:
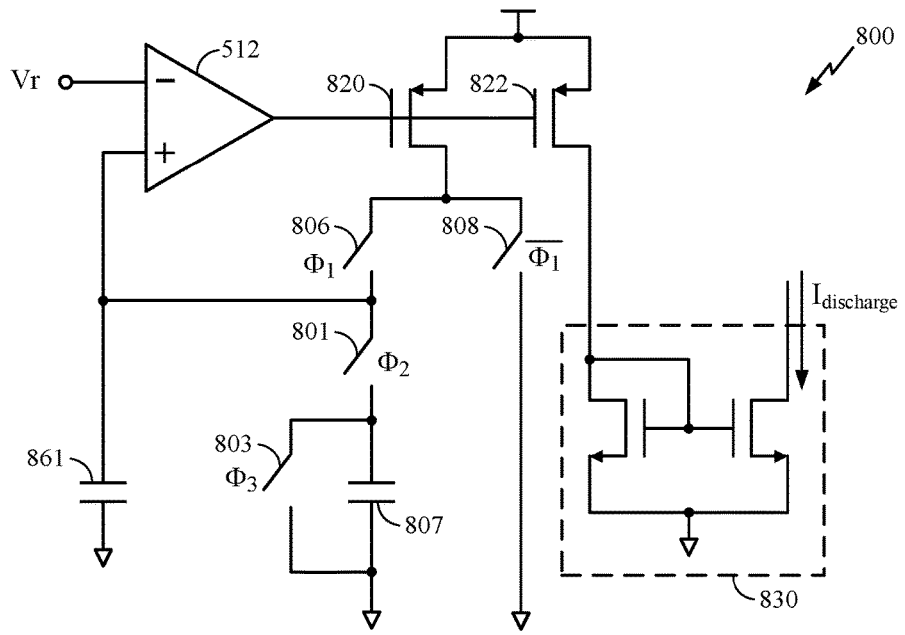
FIGS. 8A and 8B are a schematic diagram of an example circuit and a corresponding timing diagram of signals for generating a discharge current, in accordance with certain aspects of the present disclosure.
Figure 8B:
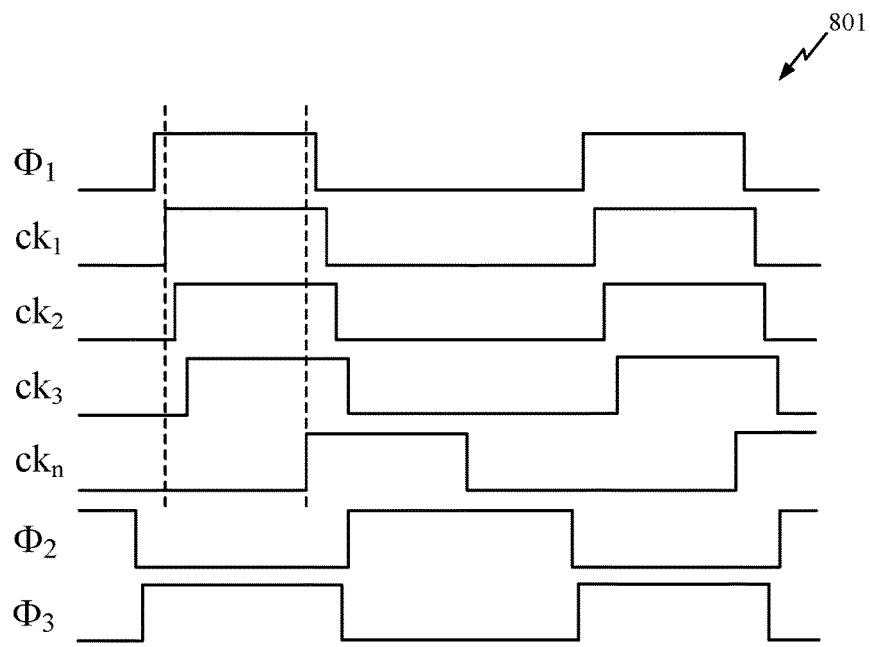

FIGS. 8A and 8B are a schematic diagram of an example circuit 800 and a corresponding timing diagram 801 of signals for generating a discharge current (e.g., $I_{discharge}$) proportional to C/Δt, in accordance with certain aspects of the present disclosure. For example, the circuit 800 may implement the current source 708 of FIG. 7. As illustrated in FIGS. 8A and 8B, the capacitor 506 (e.g., having a capacitance C equal to the capacitance C of one of capacitors 705) is charged/discharged by opening and closing switches 801 and 803 based on signals Φ2 and Φ3 having a frequency equal to the sampling frequency Fs of the TDC-based quantizer 700. In certain aspects, signals Φ2 and Φ3 may be non-overlapping signals. For example, as illustrated in FIG. 8B, only one of the signals Φ2 and Φ3 is logic high at any point in time. The amplifier 512 drives the gates of transistors 820 and 822 such that the voltage at the positive terminal of the amplifier 512 is equal to a reference voltage Vr. In certain aspects, a capacitor 861 may be coupled to the positive terminal of the amplifier 512.

The switches 806 and 808 are controlled by a control signal Φ1 and the inverse of the control signal Φ1, respectively, as illustrated. In certain aspects, the signal Φ1 may be proportional to Δt. The signal Φ1 may be generated by the delay line 730 such that a pulse width of the signal Φ1 spans the transition edges (e.g., rising edges) of any number of clock signals. For example, as illustrated in FIG. 8B, the pulse width of the signal Φ1 may span the rising edges of the clock signals $ck_1$ to $ck_n$ used to drive the clock inputs of the FFs 422. Therefore, the source-to-drain current of transistor 820 is proportional to C/Δt. Since the gates of transistors 820 and 822 are coupled together and the sources of transistors 820 and 822 are coupled together, the source-to-drain current of transistor 822 is also proportional to C/Δt, which is mirrored by a current mirror 830 to generate the discharge current $I_{discharge}$.

Figure 9:
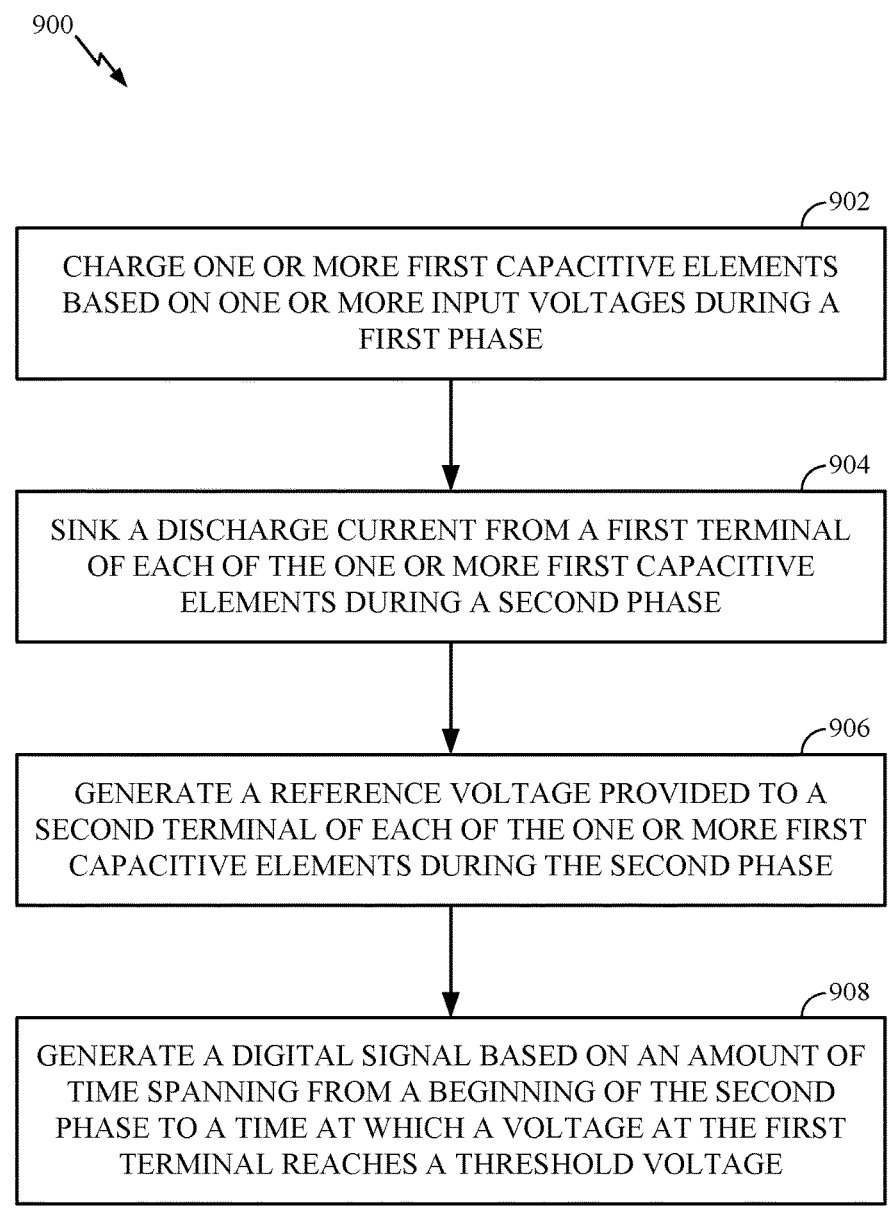
FIG. 9 is a flow diagram illustrating example operations for analog-to-digital conversion, in accordance with certain aspects of the present disclosure.

FIG. 9 is a flow diagram illustrating example operations 900 for analog-to-digital conversion, in accordance with certain aspects of the present disclosure. The operations 900 may be performed by a circuit, such as the TDC-based quantizer 400 of FIG. 4 or the TDC-based quantizer 700 of FIG. 7.

The operations 900 may begin, at block 902, by charging one or more first capacitive elements (e.g., capacitor 402 or capacitors 705) based on one or more input voltages during a first phase (e.g., phase Φ1), and at block 904, sinking a discharge current from a first terminal of each of the one or more first capacitive elements during a second phase (e.g., phase Φ2). In certain aspects, a reference voltage (e.g., reference voltage Vref+Vth as illustrated in FIG. 4, or $V_{int}$ as illustrated in FIG. 7) is generated at block 906. The reference voltage may be provided to a second terminal of each of the one or more first capacitive elements during the second phase. At block 908, a digital signal is generated based on an amount of time spanning from a beginning of the second phase to a time at which a voltage at the first terminal reaches a threshold voltage.

In certain aspects, the one or more first capacitive elements may have the same capacitance, and the discharge current may be proportional to a product of a sampling frequency of the analog-to-digital conversion and the capacitance of the one or more first capacitive elements.

In certain aspects, the one or more first capacitive elements may comprise a plurality of capacitive elements and the input voltages may comprise a plurality of input voltages. In this case, the operations 900 may also include integrating (e.g., via DC integrator 640) one of the plurality of input voltages, the reference voltage being generated based on the integration. In certain aspects, each of the plurality of input voltages may be a feedforward voltage of a loop filter (e.g., loop filter 604).

In certain aspects, the operations 900 may also include comparing (e.g., via the inverter 414 or the ZCD 706) the voltage at the first terminal with the threshold voltage during the second phase. In this case, the amount of time is determined based on the comparison. In certain aspects, the operations 900 may also include generating an output signal based on the comparison. In this case, the digital signal is generated by latching (e.g., via the FFs 422) the output signal based on detection of one of a plurality of transition edges of a plurality of clock signals.

In certain aspects, the operations 900 may also include generating a control signal (e.g., the Φ1 signal), the plurality of transition edges of the clock signals occurring during a pulse width of the control signal. In this case, the sinking of the discharge current from the first terminal of each of the one or more first capacitive elements may include generating the discharge current based on the control signal.

In certain aspects, the sinking of the discharge current may include generating a current by driving (e.g., via amplifier 512) a control input of a transistor (e.g., transistor 508 or 820) selectively coupled to a second capacitive element (e.g., capacitor 506). In this case, the sinking of the discharge current may also include charging the second capacitive element during a third phase, discharging the second capacitive element during a fourth phase, and generating the discharge current by mirroring (e.g., via current mirror 830) the current generated by driving the control input of the transistor. In some cases, the third phase may be the same as the first phase and the fourth phase may be the same as the second phase. In certain aspects, the operations 900 also include comparing the voltage at the first terminal with the threshold voltage during the second phase, wherein the amount of time is determined based on the comparison. In this case, the generation of the digital signal comprises generating an output signal based on the comparison, and latching the output signal based on detection of one of a plurality of transition edges of a plurality of clock signals. In certain aspects, the operations 900 also include generating a control signal, wherein the plurality of transition edges occur during a pulse width of the control signal, and selectively coupling the transistor to the second capacitive element based on the control signal. In certain aspects, the charging and the discharging are performed based on non-overlapping signals having a frequency equal to a sampling frequency of the analog-to-digital conversion.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. For example, means for charging and means for discharging may comprise a switch, such as the switches 406, 408, and/or 410 of FIG. 4, or switches 702, 703, 704 and/or 707 of FIG. 7, each of which may be implemented by a transistor. In certain aspects, a controller such as the controller 230 of FIG. 2 may control the operations of the switches. Means for generating a reference voltage may comprise a voltage source, such as the reference voltage source 404 or an integrator, such as the DC integrator 640. Means for generating a digital signal may comprise an edge detection circuit, such as the edge detection circuit 416 or 751.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with discrete hardware components designed to perform the functions described herein. The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A quantizer using a time-to-digital converter (TDC) comprising:
   at least one first capacitive element;
   a set of switches configured to selectively couple a first terminal and a second terminal of the at least one first capacitive element to at least one input voltage source;
   a reference voltage source;
   at least one switch coupled between the second terminal of the at least one first capacitive element and an output of the reference voltage source;
   a current source selectively coupled to the first terminal of the at least one first capacitive element; and
   a voltage sense circuit coupled to the first terminal of the at least one first capacitive element.

2. The quantizer of claim 1, wherein:
   the set of switches is configured to allow charging of the at least one first capacitive element to a voltage provided by a respective one of the at least one input voltage source during a first phase;
   the at least one switch is configured to couple the second terminal of the at least one first capacitive element to the output of the reference voltage source during a second phase; and
   the current source is configured to sink a discharge current from the at least one first capacitive element during the second phase.

3. The quantizer of claim 2, wherein the discharge current that the current source is configured to sink is proportional to a product of a sampling frequency of the TDC and a capacitance of the at least one first capacitive element.

4. The quantizer of claim 1, wherein:
   the voltage sense circuit comprises a first inverter; and
   the reference voltage source is configured to generate a voltage at the output of the reference voltage source that is a sum of a reference voltage of the TDC and a threshold voltage of a second inverter, the second inverter being a replica of the first inverter.

5. The quantizer of claim 1, wherein:
   the at least one first capacitive element comprises a plurality of capacitive elements;
   the at least one input voltage source comprises a plurality of input voltage sources;
   the set of switches is configured to selectively couple each of the plurality of capacitive elements to a respective one of the plurality of input voltage sources; and
   the reference voltage source comprises a direct-current (DC) integrator having an input coupled to one of the plurality of input voltage sources.

6. The quantizer of claim 5, wherein:
   the quantizer is part of an apparatus having a loop filter; and
   each of the plurality of input voltage sources comprises a feedforward output of the loop filter.

7. The quantizer of claim 1, wherein the current source comprises:
   an amplifier;
   a first transistor and a second transistor having gates coupled to an output of the amplifier, a drain of the first transistor being coupled to an input of the amplifier;
   a second capacitive element;
   a first switch coupled between the input of the amplifier and the second capacitive element;
   a second switch coupled in parallel with the second capacitive element; and
   a current mirror having a first branch coupled to the second transistor and a second branch selectively coupled to the first terminal of the at least one first capacitive element.

8. The quantizer of claim 7, wherein the first switch and the second switch are controlled by non-overlapping signals having a frequency equal to a sampling frequency of the TDC.

9. The quantizer of claim 1, wherein the current source comprises:
   an amplifier;
   a first transistor and a second transistor having gates coupled to an output of the amplifier;
   a first switch and a second switch, the first switch being coupled between a drain of the first transistor and an input of the amplifier, and the second switch being coupled between the drain of the first transistor and a reference potential node;
   a second capacitive element;
   a third switch and a fourth switch, the third switch being coupled between the input of the amplifier and the second capacitive element, and the fourth switch being coupled in parallel with the second capacitive element and between the reference potential node and the second switch; and
   a current mirror having a first branch coupled to the second transistor and a second branch selectively coupled to the first terminal of the at least one first capacitive element.

10. The quantizer of claim 9, wherein the third switch and the fourth switch are controlled by non-overlapping signals having a frequency equal to a sampling frequency of the TDC.

11. The quantizer of claim 9, wherein:
    the voltage sense circuit comprises a comparison circuit configured to compare a voltage at the first terminal with a threshold voltage;
    the quantizer further comprises an edge detection circuit, the edge detection circuit comprising a series of flip-flops each configured to latch an output of the comparison circuit after detecting a transition edge of one of a plurality of clock signals; and
    the first switch and the second switch are controlled by a control signal and an inverse of the control signal, respectively, the transition edges of the plurality of clock signals occurring during a pulse width of the control signal.

12. The quantizer of claim 11, wherein the current source is configured to sink a discharge current that is proportional to a capacitance of the at least one first capacitive element divided by a fraction of the pulse width.

13. The quantizer of claim 12, wherein the fraction of the pulse width comprises a time difference between two consecutive transition edges of the plurality of clock signals.

14. The quantizer of claim 11, wherein the comparison circuit comprises a zero-crossing detector and wherein the threshold voltage is 0 V.

15. The quantizer of claim 1, wherein the voltage sense circuit comprises:
a comparison circuit configured to compare a voltage at the first terminal with a threshold voltage; and
a series of flip-flops each configured to latch an output of the comparison circuit after detecting one of a plurality of transition edges of a plurality of clock signals.

16. The quantizer of claim 15, wherein the voltage sense circuit comprises a delay-locked loop (DLL), wherein the clock signals are generated by the DLL.

17. The quantizer of claim 16, wherein:
the DLL is configured to generate a control signal, the transition edges of the plurality of clock signals occurring during a pulse width of the control signal; and
the current source is configured to generate a discharge current based on the control signal generated by the DLL.

18. A method for analog-to-digital conversion, comprising:
charging one or more first capacitive elements based on one or more input voltages during a first phase;
sinking a discharge current from a first terminal of each of the one or more first capacitive elements during a second phase;
generating a reference voltage provided to a second terminal of each of the one or more first capacitive elements during the second phase; and
generating a digital signal based on an amount of time spanning from a beginning of the second phase to a time at which a voltage at the first terminal reaches a threshold voltage.

19. The method of claim 18, wherein the one or more first capacitive elements have a same capacitance, and wherein the discharge current is proportional to a product of a sampling frequency of the analog-to-digital conversion and the capacitance of the one or more first capacitive elements.

20. The method of claim 18, wherein:
the one or more first capacitive elements comprise a plurality of capacitive elements;
the input voltages comprise a plurality of input voltages; and
the method further comprises integrating one of the plurality of input voltages, the reference voltage being generated based on the integration.

21. The method of claim 20, wherein each of the plurality of input voltages comprises a feedforward voltage of a loop filter.

22. The method of claim 18, further comprising:
comparing the voltage at the first terminal with the threshold voltage during the second phase, wherein the amount of time is determined based on the comparison.

23. The method of claim 22, further comprising:
generating an output signal based on the comparison, wherein generating the digital signal comprises latching the output signal based on detection of one of a plurality of transition edges of a plurality of clock signals.

24. The method of claim 23, further comprising:
generating a control signal, wherein:
the plurality of transition edges of the clock signals occur during a pulse width of the control signal; and
the sinking of the discharge current from the first terminal of each of the one or more first capacitive elements comprises generating the discharge current based on the control signal.

25. The method of claim 18, wherein the sinking of the discharge current comprises:
generating a current by:
driving a control input of a transistor selectively coupled to a second capacitive element;
charging the second capacitive element during a third phase; and
discharging the second capacitive element during a fourth phase; and
generating the discharge current by mirroring the current generated by driving the control input of the transistor.

26. The method of claim 25, wherein the third phase is the same as the first phase and the fourth phase is the same as the second phase.

27. The method of claim 25, further comprising:
comparing the voltage at the first terminal with the threshold voltage during the second phase, wherein the amount of time is determined based on the comparison, and wherein the generation of the digital signal comprises:
generating an output signal based on the comparison; and
latching the output signal based on detection of one of a plurality of transition edges of a plurality of clock signals;
generating a control signal, wherein the plurality of transition edges occur during a pulse width of the control signal; and
selectively coupling the transistor to the second capacitive element based on the control signal.

28. The method of claim 27, wherein the charging and the discharging are performed based on non-overlapping signals having a frequency equal to a sampling frequency of the analog-to-digital conversion.

29. An apparatus for analog-to-digital conversion, comprising:
means for charging one or more first capacitive elements based on one or more input voltages during a first phase;
means for sinking a discharge current from a first terminal of each of the one or more first capacitive elements during a second phase;
means for generating a reference voltage provided to a second terminal of each of the one or more first capacitive elements during the second phase; and
means for generating a digital signal based on an amount of time spanning from a beginning of the second phase to a time at which a voltage at the first terminal reaches a threshold voltage.

* * * * *